(12) United States Patent
Jeong et al.

(10) Patent No.: US 12,525,400 B2
(45) Date of Patent: Jan. 13, 2026

(54) COMPOSITE ELECTRONIC COMPONENT

(71) Applicant: SAMSUNG ELECTRO-MECHANICS CO., LTD., Suwon-si (KR)

(72) Inventors: Dae Heon Jeong, Suwon-si (KR); Soo Hwan Son, Suwon-si (KR); Young Ghyu Ahn, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 202 days.

(21) Appl. No.: 18/243,250

(22) Filed: Sep. 7, 2023

(65) Prior Publication Data
US 2024/0222026 A1 Jul. 4, 2024

(30) Foreign Application Priority Data
Dec. 28, 2022 (KR) .................. 10-2022-0187002

(51) Int. Cl.
H01G 4/232 (2006.01)
H01G 4/30 (2006.01)
H05K 1/18 (2006.01)

(52) U.S. Cl.
CPC ............ *H01G 4/2325* (2013.01); *H01G 4/30* (2013.01); *H05K 1/181* (2013.01);
(Continued)

(58) Field of Classification Search
None
See application file for complete search history.

(56) References Cited

U.S. PATENT DOCUMENTS 4,152,477 A * 5/1979 Haruta .................. C23C 18/30
428/209
4,771,159 A * 9/1988 O'Leary .............. H05K 3/3485
219/85.22
(Continued)

FOREIGN PATENT DOCUMENTS

EP 0265077 A2 * 4/1988
JP H0347693 * 2/1991
(Continued)

*Primary Examiner* — Timothy J. Dole
*Assistant Examiner* — Muhammed Azam
(74) *Attorney, Agent, or Firm* — Morgan, Lewis & Bockius LLP

(57) ABSTRACT

A composite electronic component includes a body including a dielectric layer and first and second internal electrodes and including first and second surfaces opposing each other in the first direction, third and fourth surfaces opposing each other in a second direction, and fifth and sixth surfaces opposing each other in a third direction, a first external electrode disposed on the third surface and extending onto at least a portion of the first surface, a second external electrode disposed on the fourth surface and extending onto at least a portion of the first surface, a first insulating substrate disposed on a portion of the first external electrode disposed on the first surface, and a second insulating substrate disposed on a portion of the second external electrode disposed on the first surface, wherein the first and second insulating substrates each include a plurality of spherical particles inside a resin.

19 Claims, 6 Drawing Sheets

(52) U.S. Cl.
CPC ........... *H05K 2201/0212* (2013.01); *H05K 2201/10015* (2013.01); *H05K 2201/10636* (2013.01)

(56) References Cited

U.S. PATENT DOCUMENTS

| | | | | |
|---|---|---|---|---|
| 5,371,327 | A * | 12/1994 | Fujinami | H05K 3/361 |
| | | | | 174/257 |
| 6,214,446 | B1 * | 4/2001 | Funada | B32B 27/20 |
| | | | | 428/212 |
| 7,118,940 | B1 * | 10/2006 | Myers | H01L 24/29 |
| | | | | 257/E21.503 |
| 7,189,927 | B2 * | 3/2007 | Sakuyama | H05K 7/1061 |
| | | | | 29/842 |
| 7,807,547 | B2 * | 10/2010 | Summers | B81C 1/00269 |
| | | | | 438/455 |
| 8,154,123 | B2 * | 4/2012 | Kondou | H05K 3/3436 |
| | | | | 257/737 |
| 8,240,016 | B2 * | 8/2012 | Motoki | H01G 4/232 |
| | | | | 29/25.03 |
| 8,883,894 | B2 * | 11/2014 | Sekito | C08J 5/18 |
| | | | | 524/133 |
| 9,520,234 | B2 * | 12/2016 | Kang | H01G 4/30 |
| 9,572,255 | B2 * | 2/2017 | Nomura | B23K 35/262 |
| 9,572,261 | B2 * | 2/2017 | Romig | H01L 21/76805 |
| 10,454,445 | B2 * | 10/2019 | Lee | H01F 27/292 |
| 10,665,392 | B2 * | 5/2020 | Terashita | H01G 4/12 |
| 11,139,114 | B2 * | 10/2021 | Ahn | H01G 4/012 |
| 11,348,733 | B2 * | 5/2022 | Hattori | H01G 4/248 |
| 11,812,562 | B2 * | 11/2023 | Isaacs | H05K 3/3463 |
| 12,073,994 | B2 * | 8/2024 | Yokomizo | H01G 4/248 |
| 2004/0134976 | A1 * | 7/2004 | Keyser | B23K 35/0244 |
| | | | | 228/248.1 |
| 2005/0006442 | A1 * | 1/2005 | Stillabower | H05K 3/3442 |
| | | | | 257/737 |
| 2006/0043597 | A1 * | 3/2006 | Wada | C22C 12/00 |
| | | | | 257/772 |
| 2007/0025091 | A1 * | 2/2007 | Shimada | H05K 3/387 |
| | | | | 361/750 |
| 2009/0008776 | A1 * | 1/2009 | Kitae | H01L 24/11 |
| | | | | 257/737 |
| 2009/0014873 | A1 * | 1/2009 | Yokota | H01L 23/3185 |
| | | | | 257/737 |
| 2010/0147567 | A1 * | 6/2010 | Hino | C22C 12/00 |
| | | | | 174/257 |
| 2012/0099241 | A1 * | 4/2012 | Chang | H01G 4/012 |
| | | | | 361/301.4 |
| 2014/0063683 | A1 * | 3/2014 | Gu | H01G 4/2325 |
| | | | | 427/79 |
| 2014/0076621 | A1 * | 3/2014 | Arnold | H01G 4/01 |
| | | | | 219/121.64 |
| 2015/0170786 | A1 * | 6/2015 | Hong | H01B 1/02 |
| | | | | 427/79 |
| 2015/0206661 | A1 | 7/2015 | Fujimura et al. | |
| 2016/0020033 | A1 * | 1/2016 | Shin | H01G 2/065 |
| | | | | 361/301.4 |
| 2016/0268050 | A1 * | 9/2016 | Hattori | H01C 1/012 |
| 2016/0309585 | A1 | 10/2016 | Nakamura et al. | |
| 2021/0035742 | A1 * | 2/2021 | Hattori | H01G 4/30 |
| 2023/0105989 | A1 * | 4/2023 | Ishikawa | H01L 23/3737 |
| | | | | 428/328 |
| 2023/0282422 | A1 * | 9/2023 | Song | H01G 4/1209 |
| | | | | 361/306.3 |
| 2024/0222026 | A1 * | 7/2024 | Jeong | H05K 1/181 |

FOREIGN PATENT DOCUMENTS

| | | | |
|---|---|---|---|
| JP | 2015-135910 A | 7/2015 | |
| JP | 2016-207787 A | 12/2016 | |
| JP | 2021-027054 A | 2/2021 | |
| KR | 20180070469 A * | 6/2018 | ............ H01G 2/08 |

* cited by examiner

COMPOSITE ELECTRONIC COMPONENT

CROSS-REFERENCE TO RELATED APPLICATION (S)

This application claims benefit of priority to Korean Patent Application No. 10-2022-0187002 filed on Dec. 28, 2022 in the Korean Intellectual Property Office, the disclosure of which is incorporated herein by reference in its entirety.

BACKGROUND

1. Field

The present disclosure relates to a composite electronic component.

2. Description of Related Art

A multilayer ceramic capacitor (MLCC), one of multilayer electronic components, is a chip-type capacitor mounted on the printed circuit boards of various types of electronic products such as imaging devices including liquid crystal displays (LCDs) and plasma display panels (PDPs), computers, smartphones, cell phones, and the like, to allow electricity to be charged therein and discharged therefrom.

Such an MLCC may be used as a component of various electronic devices due to advantages thereof such as compactness, guaranteed high capacitance, and ease of mounting. As various electronic devices such as computers and mobile devices have been reduced in size and increased in power, demand for miniaturization and high capacitance of multilayer ceramic capacitors have been increased.

The multilayer ceramic capacitor may have a structure in which a plurality of dielectric layers and internal electrodes having different polarities are alternately stacked between the dielectric layers. Since the dielectric layer has piezoelectricity and electrostriction, when a direct current or an alternating current voltage is applied to the multilayer ceramic capacitor, a piezoelectric phenomenon may occur in the dielectric layer to cause vibration.

Such vibration is transmitted to a printed circuit board on which the multilayer ceramic capacitor is mounted through external electrodes of the multilayer ceramic capacitor, thereby generating vibration sound. The vibration sound may correspond to an audible frequency in the range of 20 to 20,000 Hz that is unpleasant to humans, and the vibration sound that is unpleasant to humans is referred to as acoustic noise.

The acoustic noise appears at a level that may be sufficiently recognized by users as recent electronic devices have been used with high voltage and in environments in which voltages are fluctuated, and recently, as the dielectric layers have been thinned and multilayered, acoustic noise occurs even at low AC voltages less than 1V. Consequently, demand for new products capable of reducing acoustic noise has continued to rise.

SUMMARY

Exemplary embodiments provide a composite electronic component having reduced acoustic noise and a mounting board thereof.

According to an aspect of the present disclosure, a composite electronic component includes: a body including a dielectric layer and first and second internal electrodes alternately disposed in a first direction with the dielectric layer interposed therebetween and including first and second surfaces opposing each other in the first direction, third and fourth surfaces connected to the first and second surfaces and opposing each other in a second direction, and fifth and sixth surfaces connected to the first to fourth surfaces and opposing each other in a third direction; a first external electrode disposed on the third surface and extending onto at least a portion of the first surface; a second external electrode disposed on the fourth surface and extending onto at least a portion of the first surface; a first insulating substrate disposed on a portion of the first external electrode disposed on the first surface; and a second insulating substrate disposed on a portion of the second external electrode disposed on the first surface, wherein the first and second insulating substrates each include a plurality of spherical particles including a resin.

According to an aspect of the present disclosure, a board on which a composite electronic component is mounted, includes: a printed circuit board having a plurality of electrode pads on one surface; the composite electronic component described above installed on the printed circuit board; and a solder connecting the electrode pad to the composite electronic component.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
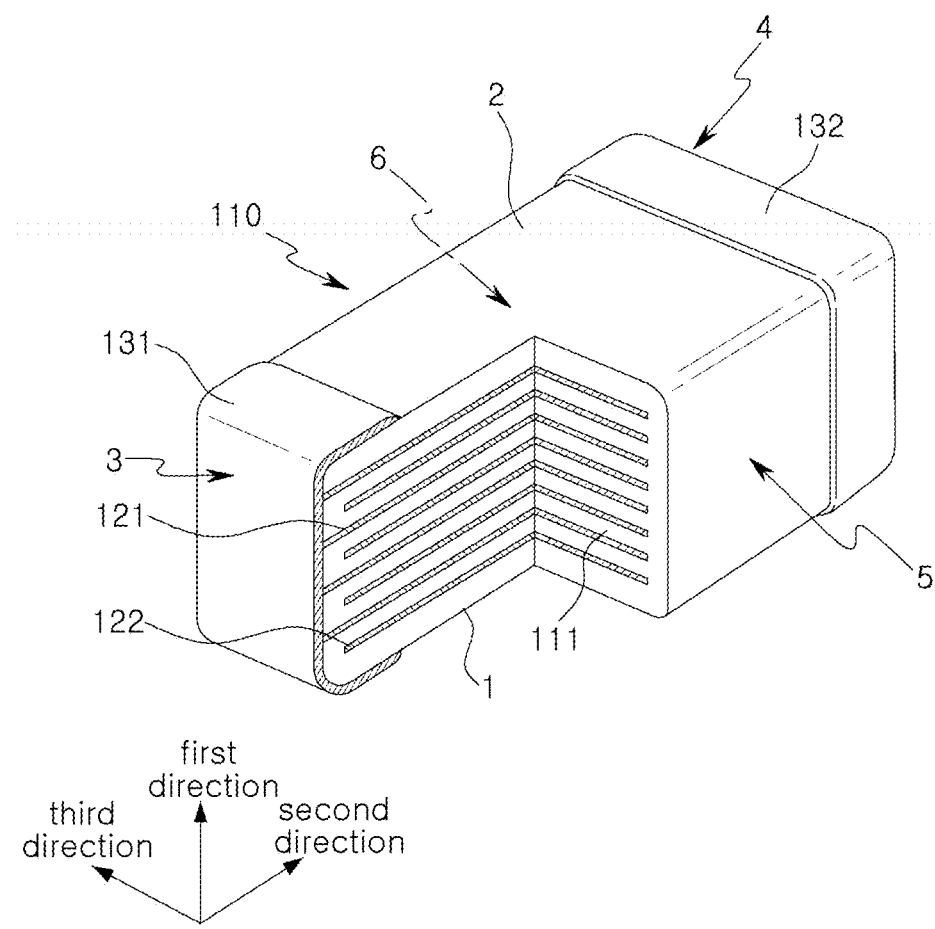
FIG. 1 is a perspective view schematically illustrating a body and external electrodes according to an exemplary embodiment in the present disclosure.

Hereinafter, exemplary embodiments of the present inventive concept will be described in detail with reference to the accompanying drawings. The inventive concept may, however, be exemplified in many different forms and should not be construed as being limited to the specific exemplary embodiments set forth herein. Rather, these exemplary embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements.

To clarify the present disclosure, portions irrespective of description are omitted and like numbers refer to like elements throughout the specification, and in the drawings, the thickness of layers, films, panels, regions, etc., are exaggerated for clarity. Also, in the drawings, like reference numerals refer to like elements although they are illustrated in different drawings. Throughout the specification, unless explicitly described to the contrary, the word "comprise" and variations, such as "comprises" or "comprising", will be understood to imply the inclusion of stated elements but not the exclusion of any other elements.

In the drawing, a first direction may be defined as a thickness (T) direction, a second direction may be defined as a length (L) direction, and a third direction may be defined as a width (W) direction.

Composite Electronic Component

FIG. 1 is a perspective view schematically illustrating a body and external electrodes according to an exemplary embodiment in the present disclosure.

Figure 2:
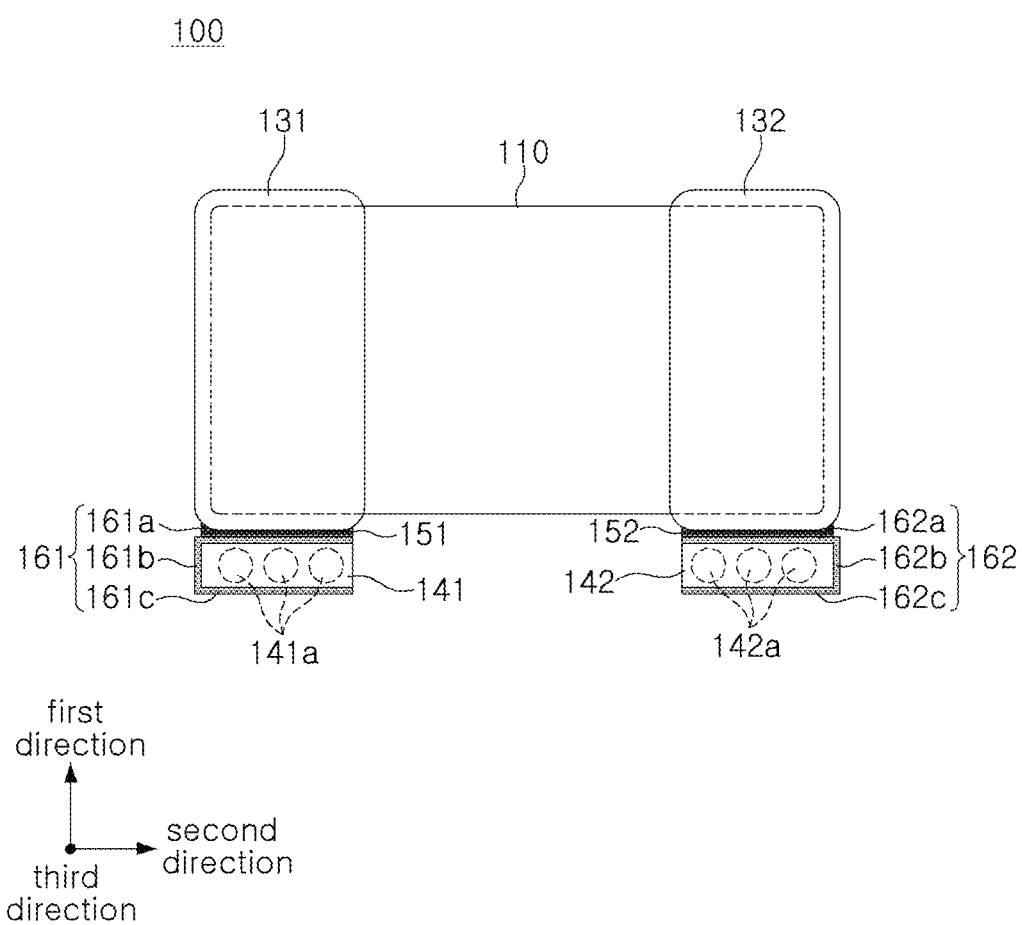
FIG. 2 is a side view schematically illustrating a composite electronic component according to an exemplary embodiment in the present disclosure.

FIG. 2 is a side view schematically illustrating a composite electronic component according to an exemplary embodiment in the present disclosure.

Figure 3:
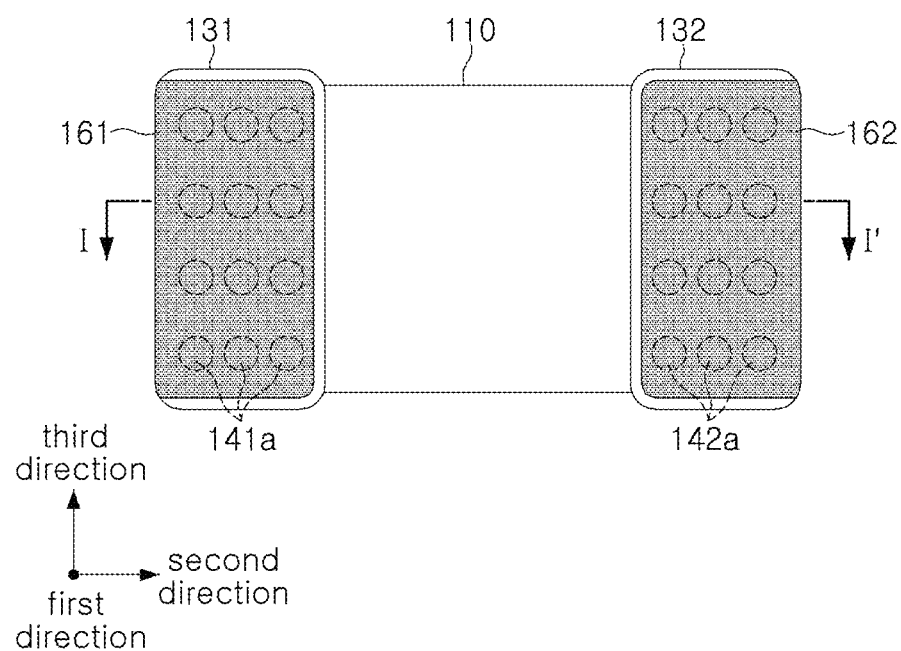
FIG. 3 is a bottom view schematically illustrating a composite electronic component according to an exemplary embodiment in the present disclosure.

FIG. 3 is a bottom view schematically illustrating a composite electronic component according to an exemplary embodiment in the present disclosure.

Figure 4:
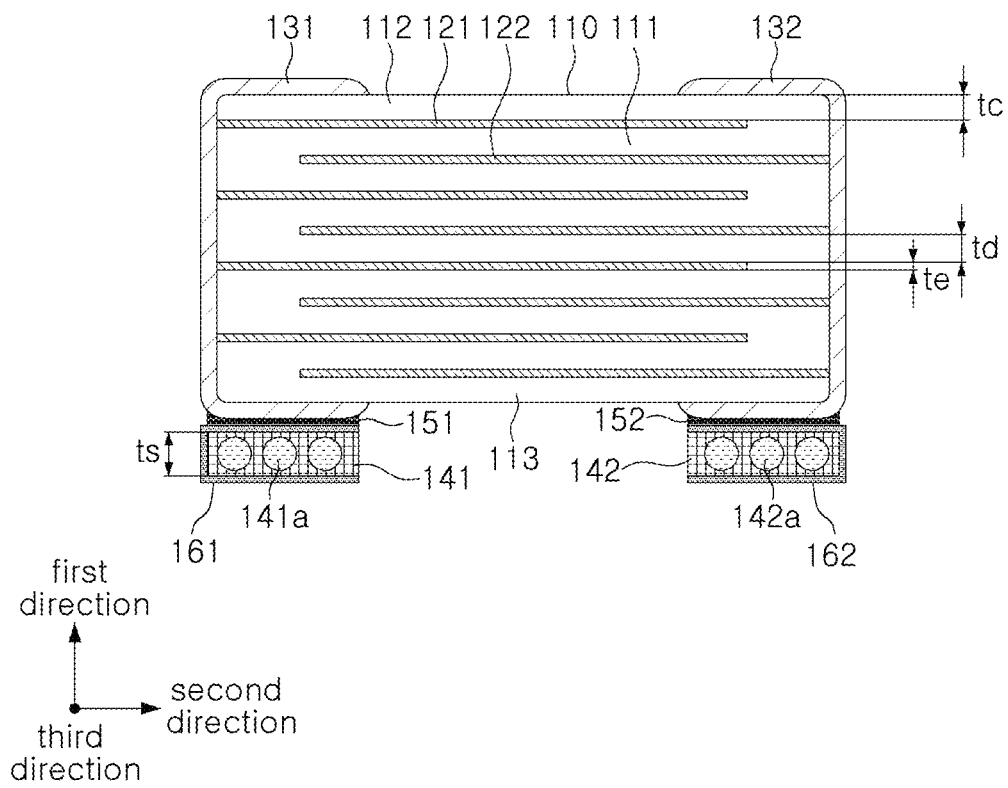
FIG. 4 is a cross-sectional view taken along line I-I' of FIG. 3.

FIG. 4 is a cross-sectional view taken along line I-I' of FIG. 3.

Hereinafter, a composite electronic component 100 according to an exemplary embodiment in the present disclosure will be described in detail with reference to FIGS. 1 to 4. In addition, a multilayer ceramic capacitor (MLCC) will be described as an example of a composite electronic component, but the present disclosure is not limited thereto, and various composite electronic components, such as inductors, piezoelectric devices, varistors, or thermistors.

Referring to FIGS. 1 to 4, the composite electronic component 100 according to an exemplary embodiment in the present disclosure may include a body 110 including a dielectric layer 111 and first and second internal electrodes 121 and 122 alternately disposed in a first direction with the dielectric layer 111 interposed therebetween and including first and second surfaces 1 and 2 opposing each other in the first direction, third and fourth surfaces 3 and 4 connected to the first and second surfaces 1 and 2 and opposing each other in a second direction, and fifth and sixth surfaces 5 and 6 connected to the first to fourth surfaces 1, 2, 3 and 4 and opposing each other in a third direction; a first external electrode 131 disposed on the third surface 3 and extending onto at least a portion of the first surface 1; a second external electrode 132 disposed on the fourth surface 4 and extending onto at least a portion of the first surface 1; a first insulating substrate 141 disposed on a portion of the first external electrode disposed on the first surface 1; and a second insulating substrate 142 disposed on a portion of the second external electrode disposed on the first surface 1, wherein the first and second insulating substrates include a plurality of spherical particles 141a and 142a including a resin, respectively.

According to an exemplary embodiment in the present disclosure, the insulating substrates 141 and 142 including a plurality of spherical particles 141a and 142a are disposed on portions of the external electrodes 131 and 132 extending onto at least portions of the first surface 1, thereby absorbing vibration transmitted to a printed circuit board (PCB) to reduce acoustic noise, when the composite electronic component is mounted.

Hereinafter, each component included in the composite electronic component 100 according to an exemplary embodiment in the present disclosure will be described in more detail.

Referring to FIG. 1, although a specific shape of the body 110 is not particularly limited, as shown, the body 110 may have a hexahedral shape or a shape similar thereto. Due to the shrinkage of ceramic powder included in the body 110 during a sintering process or polishing of corners of the body, the body 110 may not have a perfectly straight hexahedral shape but may have a substantially hexahedral shape.

The body 110 may include the first and second surfaces 1 and 2 opposing each other in the first direction, the third and fourth surfaces 3 and 4 connected to the first and second surfaces 1 and 2 and opposing each other in the second direction, and the fifth and sixth surfaces 5 and 6 connected to the first to fourth surfaces 1, 2, 3, and 4 and opposing each other in the third direction.

In the body 110, the dielectric layers 111 and the internal electrodes 121 and 122 may be alternately stacked. The plurality of dielectric layers 111 constituting the body 110 are in a sintered state, and adjacent dielectric layers 111 may be integrated such that boundaries therebetween may not be readily apparent without using a scanning electron microscope (SEM).

The dielectric layer 111 may be formed by preparing a ceramic slurry including ceramic powder, an organic solvent, and a binder, applying and drying the slurry on a carrier film to prepare a ceramic green sheet, and then firing the ceramic green sheet. The ceramic powder is not particularly limited as long as sufficient capacitance may be obtained, but for example, a barium titanate-based material, a lead composite perovskite-based material, or a strontium titanate-based material may be used. An example of the ceramic powder include $BaTiO_3$ and $(Ba_{1-x}Ca_x)TiO_3$ ($0<x<1$), $Ba(Ti_{1-y}Ca_y)O_3$ ($0<y<1$), $(Ba_{1-x}Ca_x)(Ti_{1-y}Zr_y)O_3$ ($0<x<1$, $0<y<1$) or $Ba(Ti_{1-y}Zr_y)O_3$ ($0<y<1$) in which Ca, Zr, etc. is partially dissolved in $BaTiO_3$.

An average thickness td of the dielectric layer 111 is not particularly limited, but, for example, an average thickness td of at least one of the dielectric layers 111 may be 10 μm or less. In addition, the average thickness td of the dielectric layer 111 may be arbitrarily set according to desired characteristics or uses. For example, in the case of an electronic component for high-voltage electric devices, the average thickness td of at least one of the dielectric layers 111 may be less than 2.8 μm. In addition, in the case of an electronic component for small IT devices, an average thickness td of at least one of the dielectric layers 111 may be 0.4 μm or less to achieve miniaturization and high capacitance.

In general, as a thickness of the dielectric layer 111 decreases, am electric field strength of the dielectric layer may increase, so that piezoelectricity of the dielectric layer may increase when voltage is applied. Accordingly, there is a problem in that acoustic noise of the composite electronic component occurs even at a low voltage. In contrast, the composite electronic component 100 according to an exemplary embodiment in the present disclosure includes the insulating substrates 141 and 142 including a plurality of spherical particles 141a and 142a, so that acoustic noise occurring in the composite electronic component may be effectively reduced even when the average thickness of at least one of the dielectric layers 111 is less than 2.8 μm or equal to or less than 0.4 μm.

Here, the average thickness td of the dielectric layer 111 refers to a size of the dielectric layer 111 disposed between the internal electrodes 121 and 122 in the first direction. The average thickness of the dielectric layer 111 may be measured by scanning cross-sections of the body 110 in the first and second directions with a scanning electron microscope (SEM) at a magnification of 10,000. More specifically, an average value may be obtained by measuring the thicknesses at a plurality of points of one dielectric layer 111, for example, at 30 points equally spaced in the second direction. The 30 equally spaced points may be designated in a capacitance formation portion to be described later. In addition, when the average value is measured by extending the average value measurement to ten dielectric layers 111, the average thickness of the dielectric layer 111 may be further generalized.

The internal electrodes 121 and 122 may be alternately disposed with the dielectric layer 111. For example, the first internal electrode 121 and the second internal electrode 122, which are a pair of electrodes having different polarities, may be disposed to face each other with the dielectric layer 111 interposed therebetween. The first internal electrode 121 and the second internal electrode 122 may be electrically separated from each other by the dielectric layer 111 disposed therebetween.

The first internal electrode 121 may be spaced apart from the fourth surface 4 and connected to the third surface 3. In addition, the second internal electrode 122 may be spaced apart from the third surface 3 and connected to the fourth surface 4.

Conductive metals included in the internal electrodes 121 and 122 may include one or more of nickel (Ni), copper (Cu), palladium (Pd), silver (Ag), gold (Au), platinum (Pt), tin (Sn), tungsten (W), titanium (Ti), and alloys thereof, but the present disclosure is not limited thereto.

The internal electrodes 121 and 122 may be formed by applying a conductive paste for internal electrodes including a conductive metal to have a predetermined thickness on a ceramic green sheet and firing the conductive paste. As a method of printing the conductive paste for internal electrodes, a screen printing method or a gravure printing method may be used, but the present disclosure is not limited thereto.

An average thickness te of the internal electrodes 121 and 122 may not be particularly limited, but for example, an average thickness of at least one of the first internal electrodes 121 and an average thickness of at least one of the second internal electrodes 122 may be 3 µm or less. In addition, the average thickness of the internal electrodes 121 and 122 may be arbitrarily set according to desired characteristics or uses. For example, in the case of an electronic component for high-voltage electric devices, the average thickness of at least one of the first internal electrodes 121 and the average thickness of at least one of the second internal electrodes 122 may each be less than 1 µm, and in the case of an electronic component for small IT devices, the average thickness of at least one of the first internal electrodes 121 and the average thickness of at least one of the second internal electrodes 122 may each be 0.4 µm or less to achieve miniaturization and high capacitance.

The average thickness te of the internal electrodes 121 and 122 refers to a size of the internal electrodes 121 and 122 in the first direction. Here, the average thickness of the internal electrodes 121 and 122 may be measured by scanning cross-sections of the body 110 in the first and second directions with a scanning electron microscope (SEM) at a magnification of 10,000. More specifically, the average value may be obtained by measuring the thickness at a plurality of points of one internal electrode 121 or 122, for example, at 30 points equally spaced in the second direction. The 30 equally spaced points may be designated in the capacitance formation portion to be described later. In addition, if the average value is measured by extending the average value measurement to 10 internal electrodes 121 and 122, the average thickness of the internal electrodes 121 and 122 may be further generalized.

The body 110 may include the capacitance formation portion disposed inside the body 110 and forming capacitance by including the first and second internal electrodes 121 and 122 alternately disposed with the dielectric layer 111 interposed therebetween and a first cover portion 112 and a second cover portion 113 respectively disposed on both surfaces of the capacitance formation portion opposing each other in the first direction. The cover portions 112 and 113 may basically serve to prevent damage to the internal electrodes due to physical or chemical stress. The cover portions 112 and 113 may have the same configuration as that of the dielectric layer 111 except that they do not include internal electrodes.

An average thickness tc of the cover portions 112 and 113 may not be particularly limited. However, the average thickness tc of the cover portions 112 and 113 may be 100 µm or less, 30 µm or less, or 20 µm or less in order to achieve miniaturization and high capacitance of the composite electronic component. Here, the average thickness of the cover portions 112 and 113 refers to an average thickness of each of the first cover portion 112 and the second cover portion 113. The average thickness tc of the cover portions 112 and 113 may refer to an average size of the cover portions 112 and 113 in the first direction, and may be a value obtained by averaging sizes in the first direction measured from 5 points at equal intervals in the cross-sections of the body 110 in the first and second directions.

The external electrodes 131 and 132 may include the first external electrode 131 disposed on the third surface 3 and connected to the first internal electrode 121 and the second external electrode 132 disposed on the fourth surface 4 and connected to the second internal electrode 122. Each of the first external electrode 131 and the second external electrode 132 may be disposed to extend to at least a portion of the first surface 1. In addition, the first external electrode 131 and the second external electrode 132 may each extend to at least a portion of the second, fifth, and sixth surfaces 2, 5, and 6.

A region of the first external electrode 131 disposed on the third surface may be defined as a first connection portion, and regions of the first external electrode 131 disposed on the first, second, fifth, and sixth surfaces 1, 2, 5 and 6 may be defined as a first band portion. Also, a region of the second external electrode 132 disposed on the fourth surface 4 may be defined as a second connection portion, and a region of the second external electrode 132 disposed on the first, second, fifth, and sixth surfaces 1, 2, 5 and 6 may be defined as a band portion.

The external electrodes 131 and 132 may include, for example, base electrode layers disposed on the third and fourth surfaces 3 and 4 of the body 110 and connected to the internal electrodes 121 and 122. That is, the first external electrode 131 may include a first base electrode layer disposed on the third surface 3, and the second external electrode 132 may include a second base electrode layer disposed on the fourth surface 4. The base electrode layer may be formed by dipping the third and fourth surfaces 3 and 4 of the body 110 in a conductive paste for external electrodes including conductive metal and glass, and then firing the same.

The conductive metal included in the base electrode layer may include copper (Cu), nickel (Ni), palladium (Pd), platinum (Pt), gold (Au), silver (Ag), lead (Pb) and/or alloys thereof, but the present disclosure is not limited thereto.

In addition, the first external electrode 131 may include a first plating layer disposed on the first base electrode layer, and the second external electrode 132 may include a second plating layer disposed on the second base electrode layer.

The types of the first and second plating layers are not particularly limited, and may be plating layers including nickel (Ni), tin (Sn), palladium (Pd), and/or alloys thereof, or may be formed of a plurality of layers. The first and second plating layers may be, for example, nickel (Ni) plating layers or tin (Sn) plating layers, or may have a form in which a nickel (Ni) plating layer and a tin (Sn) plating layer are sequentially formed. Also, the first and second plating layers may include a plurality of nickel (Ni) plating layers and/or a plurality of tin (Sn) plating layers.

The composite electronic component 100 according to an exemplary embodiment in the present disclosure may include a first insulating substrate 141 disposed on a portion of the first external electrode 131 disposed on the first surface 1 and a second insulating substrate 142 disposed on a portion of the second external electrode 132 disposed on the second surface 2, and the first and second insulating substrates 141 and 142 may include a plurality of spherical particles 141a and 142a including a resin, respectively. That is, the first insulating substrate 141 may be disposed on the first band portion of the first external electrode 131, and the second insulating substrate 142 may be disposed on the second band portion of the second external electrode 132. The plurality of spherical particles may include a plurality of first spherical particles 141a disposed in the first insulating substrate 141 and a plurality of second spherical particles 142a disposed in the second insulating substrate 142.

The spherical particles 141a and 142a disposed in the insulating substrates 141 and 142 may serve to absorb vibrations caused by a piezoelectric phenomenon of the dielectric layer 111 disposed between the internal electrodes 121 and 122 to reduce acoustic noise. In addition, since the spherical particles 141a and 142a include a resin having elasticity, vibration caused by the piezoelectric phenomenon may be more effectively absorbed. The type of resin is not particularly limited, but may include, for example, one or more of an epoxy resin, an acrylic resin, a silicone resin, a phenol resin, a polyimide resin, and a urethane resin.

Meanwhile, the spherical particles 141a and 142a may be formed of resin, but the present disclosure is not limited thereto, and the spherical particles 141a and 142a may include a core particle formed of a resin and a metal plating disposed on the surface of the core particle. In addition, the spherical particle herein does not mean a mathematically perfect sphere, and may include, for example, a shape in which a length ratio of the major axis to the minor axis (major axis/minor axis) is 1.45 or less.

The spherical particles 141a and 142a may be detected by analyzing cross-sections of the insulating substrates 141 and 142 with a scanning electron microscope (SEM), wavelength dispersive X-ray spectroscopy (WDX), and an optical microscope.

Meanwhile, if the spherical particles 141a and 142a are placed in a component having low external rigidity, a position of the spherical particles 141a and 142a may not be fixed, and as a result, the spherical particles 141a and 142 may not be uniformly disposed to cause a problem in that acoustic noise deviation may occur between composite electronic components. In contrast, in the case of the composite electronic component according to an exemplary embodiment in the present disclosure, the spherical particles 141a and 142a are disposed in the insulating substrates 141 and 142 having basic rigidity, so that the positions of the spherical particles 141a and 142a may be fixed, and by uniformly positioning the spherical particles 141a and 142a in the insulating substrate, the deviation of acoustic noise between composite electronic components may be reduced.

In addition, even though a reflow process for mounting the composite electronic component on a printed circuit board is performed, the insulating substrates 141 and 142 may stably fix the positions of the spherical particles 141a and 142a.

The insulating substrates 141 and 142 may be formed of a material having basic rigidity and may be formed of, for example, fiberglass-filled epoxy (e.g., FR4 substrate) or ceramic, but the present disclosure is not limited thereto.

The arrangement of the spherical particles 141a and 142a in the insulating substrates 141 and 142 may not be particularly limited. For example, the plurality of spherical particles 141a and 142a may be arranged in the second direction and/or the third direction within the insulating substrates 141 and 142. However, in order to effectively absorb vibrations occurring due to the piezoelectric phenomenon of the dielectric layer 111, the plurality of first spherical particles 141a may be arranged in the second and third directions in the first insulating substrate 141, and the plurality of second spherical particles 142a may be arranged in the second and third directions in the second insulating substrate 142.

Accordingly, the plurality of first spherical particles 141a may be arranged in one layer in the first insulating substrate 141, and the plurality of second spherical particles 142a may be arranged in one layer in the second insulating substrate 142. Accordingly, the plurality of first spherical particles 141a may be arranged not to overlap each other in the first direction, and the plurality of second spherical particles 142a may be arranged not to overlap each other in the first direction. As a result, the spherical particles 141a and 142a may be uniformly disposed in the insulating substrates 141 and 142.

The number of spherical particles 141a and 142a may not be particularly limited. However, in order to effectively reduce acoustic noise of a composite electronic component, ten or more spherical particles may be disposed in each of the first insulating substrate and the second insulating substrate. That is, ten or more first spherical particles 141a may be disposed in the first insulating substrate 141, and ten or more second spherical particles 142a may be disposed in the second insulating substrate 142. The upper limit of the number of spherical particles 141a and 142a may not be particularly limited, but for example, each of the first spherical particles 141a and the second spherical particles 142a may be 70 or less.

A size of the spherical particles 141a and 142a and the insulating substrates 141 and 142 may not be particularly limited. However, considering miniaturization and high capacitance of the composite electronic component and the acoustic noise reduction effect according to the exemplary embodiment in the present disclosure, a ratio of a thickness ts of the first insulating substrate 141 to an average particle size of the spherical particles 141a and 142a may be 0.8 or more and 1.2 or less. That is, in one exemplary embodiment, the thickness ts of the first insulating substrate 141 may be larger than the average particle size of the spherical particles 141a and 142a, and in another exemplary embodiment, the thickness ts of the first insulating substrate 141 may be smaller than the average particle size of the spherical particles 141a and 142a.

The thickness ts of the first insulating substrate 141 may not be particularly limited. However, the thickness ts of the first insulating substrate 141 may be, for example, 35 μm or more and 150 μm or less. Here, the thickness ts of the first insulating substrate 141 may refer to a size of the first insulating substrate 141 in the first direction. When the thickness ts of the first insulating substrate 141 satisfies the above range, the spherical particles 141a and 142a may be uniformly disposed in the insulating substrates 141 and 142, and accordingly, acoustic noise of the composite electronic component may be effectively reduced. Meanwhile, since the first insulating substrate 141 may be in a symmetrical relationship with the second insulating substrate 142 in the second direction, the description of the thickness of the first insulating substrate 141 may be equally applied to the second insulating substrate 142.

An average particle size of the spherical particles 141*a* and 142*a* may not be particularly limited and may be determined in consideration of the thickness ts of the first insulating substrate 141. The average particle size of the spherical particles 141*a* and 142*a* may be, for example, 28 µm or more and 180 µm or less.

Meanwhile, the length ratio of the major axis and the minor axis of the spherical particles 141*a* and 142*a*, the average particle size of the spherical particles 141*a* and 142*a*, and the thickness ts of the first insulating substrate 141 may be measured from, for example, an image of a cross-section in the first and second directions cut at the center of the insulating substrates 141 and 142 in the third direction with a scanning electron microscope (SEM) and/or an optical microscope.

In an exemplary embodiment, the composite electronic component 100 may include a first terminal electrode 161 disposed on the first insulating substrate 141 and a second terminal electrode 162 disposed on the second insulating substrate 142. The terminal electrodes 161 and 162 may serve to electrically connect the external electrodes 131 and 132 to electrode pads of the printed circuit board.

In an exemplary embodiment, the first terminal electrode 161 may include a first connection portion 161*a* disposed on an upper surface of the first insulating substrate 141, a first mounting portion 161*c* disposed on a lower surface of the first insulating substrate 141, and a first linking portion 161*b* disposed on one side surface of the first insulating substrate 141, and the second terminal electrode 162 may include a second connection portion 162*a* disposed on an upper surface of the second insulating substrate 142, a second mounting portion 162*c* disposed on a lower surface of the second insulating substrate 142, and a second linking portion 162*b* disposed on one side surface of the second insulating substrate 142.

The first linking portion 161*b* may serve to connect the first connection portion 161*a* to the first mounting portion 161*c*, and the second linking portion 162*b* may serve to connect the second connection portion 162*a* to the second mounting portion 162*c*. The first linking portion 161*b* may be disposed on an outer surface, among both side surfaces of the first insulating substrate 141 facing each other in the second direction, and the second linking portion 162*b* may be disposed on an outer surface, among both side surfaces of the second insulating substrate 142 facing each other in the second direction. However, the present disclosure is not limited thereto, and the first linking portion 161*b* may be disposed on two or more of the four side surfaces of the first insulating substrate 141 facing each other in the second or third direction, and the second linking portion 162*b* may be disposed on two or more of the four side surfaces of the second insulating substrate 142 facing each other in the second or third direction.

In an exemplary embodiment, the first linking portion 161*b* may not be disposed on an inner surface, among both side surfaces of the first insulating substrate 141 facing each other in the second direction, and the second linking portion 162*b* may not be disposed on an inner surface, among both side surfaces of the second insulating substrate 142 facing each other in the second direction.

A method of forming the terminal electrodes 161 and 162 may not be particularly limited. For example, the terminal electrodes 161 and 162 may be formed by applying a conductive paste including a conductive metal on the first and second insulating substrates 141 and 142 and firing the same. That is, the connection portion, the mounting portion, and the linking portion may be integrally formed. However, the present disclosure is not limited thereto. For example, the connection portions 161*a* and 162*a* and the mounting portions 161*c* and 162*c* may be formed by firing a conductive paste including a conductive metal, and the linking portions 161*b* and 162*b* may be formed by depositing and/or sputtering a conductive metal on one surface of the insulating substrate 141 and 142. The conductive metal included in the terminal electrodes 161 and 162 is not particularly limited, but may include, for example, one or more of Cu, Ni, Pd, Pt, Au, Ag, Pd, and Cr.

In an exemplary embodiment, the composite electronic component 100 includes a first solder portion 151 connecting the first external electrode 131 to the first terminal electrode 161 and a second solder portion 152 connecting the second external electrode 132 to the second terminal electrode 162.

For example, the solder portions 151 and 152 may include at least one of tin (Sn), antimony (Sb), cadmium (Cd), lead (Pb), zinc (Zn), aluminum (Al), and copper (Cu), but the present disclosure is not limited thereto.

Figure 5:
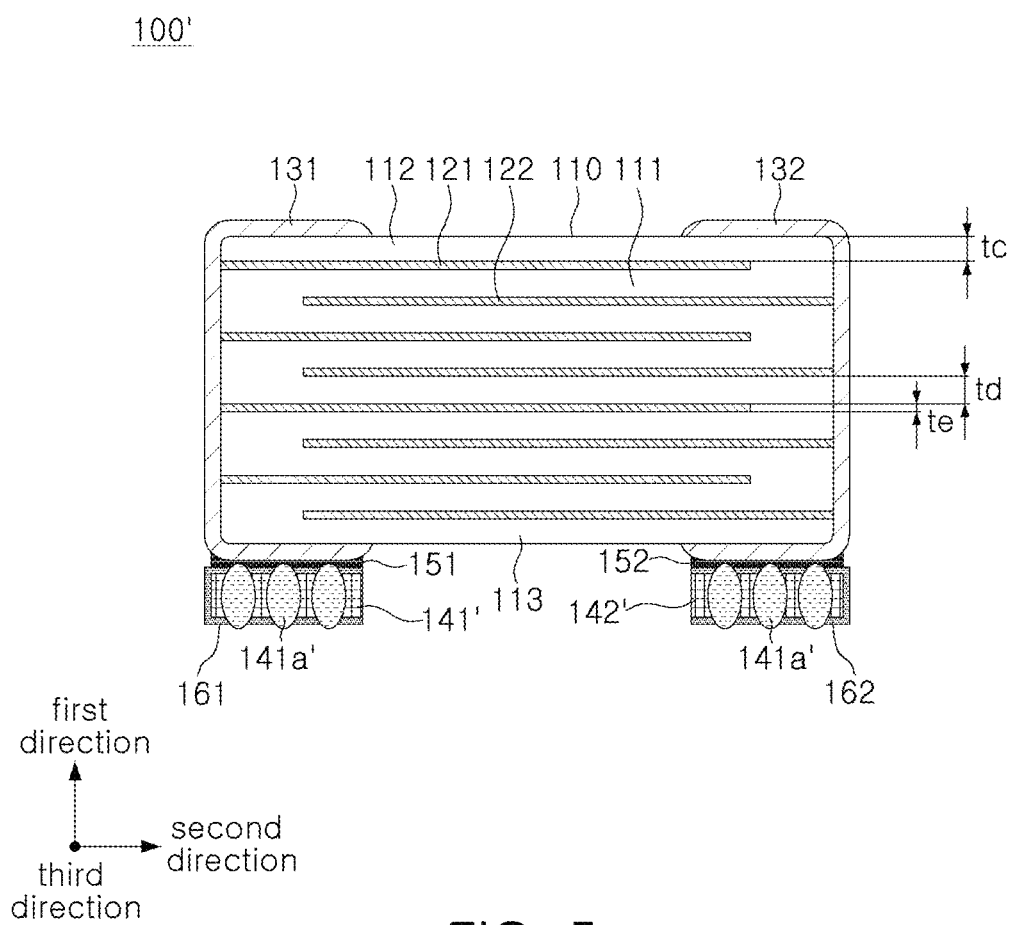
FIG. 5 is a modified example of FIG. 4.

FIG. 5 is a modified example of FIG. 4. Referring to FIG. 5, in the case of a composite electronic component 100' according to an exemplary embodiment, at least a portion of spherical particles 141*a'* and 142*a'* may protrude to both sides of a first insulating substrate 141' and a second insulating substrate 142' facing each other in the first direction. Since at least a portion of the spherical particles 141*a'* and 142*a'* protrudes to both sides of the first insulating substrate 141' and the second insulating substrate 142' facing each other in the first direction, a contact area between the external electrode and the terminal electrode may be reduced, thereby effectively reducing acoustic noise. Although not shown, at least a portion of the spherical particles 141*a'* and 142*a'* may be disposed in contact with the external electrodes 131 and 132.

Mounting Board for Composite Electronic Component

Figure 6:
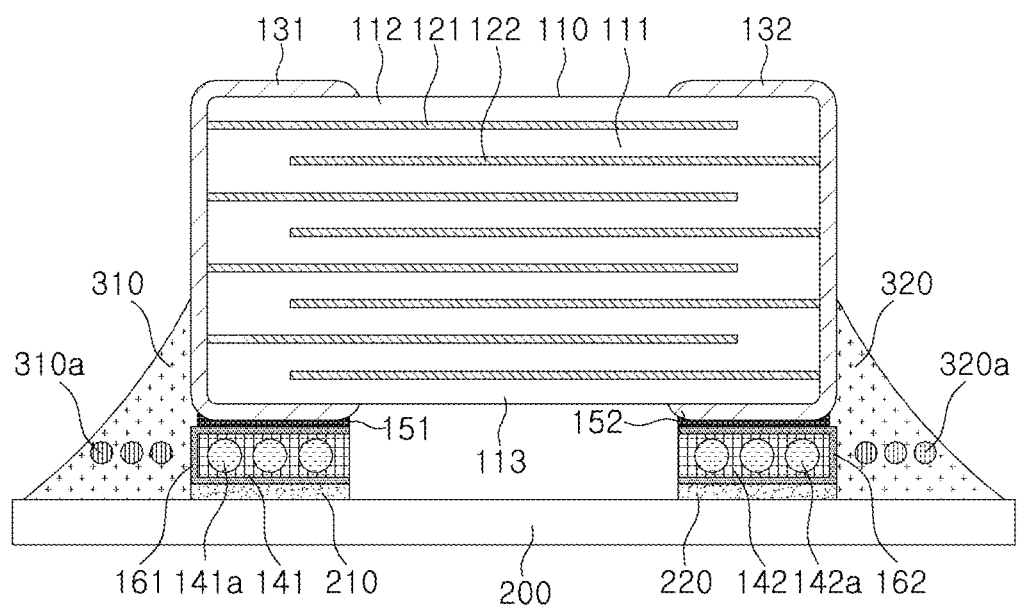
FIG. 6 is a cross-sectional view illustrating a state in which the composite electronic component of FIG. 1 is mounted on a printed circuit board.

FIG. 6 is a cross-sectional view illustrating a state in which the composite electronic component of FIG. 1 is mounted on a printed circuit board.

Referring to FIG. 6, a mounting board of a composite electronic component according to an exemplary embodiment in the present disclosure may include a printed circuit board 200 including a plurality of electrode pads 210 and 220 on one surface thereof, a composite electronic component installed on the printed circuit board, and solders 310 and 320 connecting the electrode pads to the composite electronic component.

The electrode pads 210 and 220 may include, for example, a first electrode pad 210 connected to the first terminal electrode 161 and a second electrode pad 220 connected to the second terminal electrode 162.

In addition, the first terminal electrode 161, in a state of being in contact with the first electrode pad 210, may be connected to the printed circuit board 200 by the first solder 310, and the second terminal electrode 162, in a state of being in contact with the second electrode pad 220, may be connected to the printed circuit board 200 by the second solder 320.

In this manner, when a voltage is applied with the composite electronic component mounted on the printed circuit board 200, vibration caused by a piezoelectric phenomenon of the dielectric layer 111 may be transferred to the printed circuit board 200 to cause acoustic noise.

Meanwhile, the composite electronic component according to an exemplary embodiment in the present disclosure includes the first insulating substrate 141 disposed on a portion of the first external electrode 131 disposed on the first surface 1 and the second insulating substrate 142 disposed on a portion of the second external electrode 132 disposed on the second surface 2 and each of the first and second insulating substrates 141 and 142 include a plurality of spherical particles 141a and 142a including a resin, respectively, thereby absorbing vibrations caused due to the piezoelectric phenomenon of the dielectric layer 111 to reduce acoustic noise of the composite electronic component.

In an exemplary embodiment, the solders 310 and 320 may include a plurality of third spherical particles 310a and 320a. Specifically, the first solder 310 may include a plurality of 3-1-th spherical particles 310a, and the second solder 320 may include a plurality of 3-2-th spherical particles 320a.

That is, by disposing a plurality of third spherical particles 310a and 320a on the solders 310 and 320 serving to connect the electrode pads 210 and 220 of the printed circuit board 200 to the composite electronic component, transmission of vibrations caused due to the piezoelectric phenomenon of the dielectric layer 111 to the printed circuit board 200 may be suppressed.

Meanwhile, the third spherical particles 310a and 320a may have the same structure as that of the first and second spherical particles 141a and 142a, but the present disclosure is not limited thereto. For example, the third spherical particles 310a and 320a may include metal. The metal constituting the third spherical particles 310a and 320a may be, for example, Cu and/or Ni, but the present disclosure is not limited thereto.

Also, the third spherical particles 310a and 320a may include a resin, like the first and second spherical particles 141a and 142a. In this case, in consideration of wettability with the solders 310 and 320, metal plating may be disposed on surfaces of the third spherical particles 310a and 320a, and more preferably, Sn plating may be disposed.

As one of the various effects of the present disclosure, the composite electronic component having reduced acoustic noise and a mounting board thereof may be provided.

While example exemplary embodiments have been shown and described above, it will be apparent to those skilled in the art that modifications and variations could be made without departing from the scope of the present disclosure as defined by the appended claims.

What is claimed is:

1. A composite electronic component comprising:
a body including a dielectric layer and first and second internal electrodes alternately disposed in a first direction with the dielectric layer interposed therebetween and including first and second surfaces opposing each other in the first direction, third and fourth surfaces connected to the first and second surfaces and opposing each other in a second direction, and fifth and sixth surfaces connected to the first to fourth surfaces and opposing each other in a third direction;
a first external electrode disposed on the third surface and extending onto at least a portion of the first surface;
a second external electrode disposed on the fourth surface and extending onto at least a portion of the first surface;
a first insulating substrate disposed on a portion of the first external electrode disposed on the first surface; and
a second insulating substrate disposed on a portion of the second external electrode disposed on the first surface,
wherein the first and second insulating substrates include a plurality of spherical particles each including a resin,
wherein the plurality of spherical particles comprises a plurality of first spherical particles disposed in the first insulating substrate and a plurality of second spherical particles disposed in the second insulating substrate,
the plurality of first spherical particles are arranged in the second and third directions in the first insulating substrate, and
the plurality of second spherical particles are arranged in the second direction and the third direction in the second insulating substrate.

2. The composite electronic component of claim 1, wherein
the plurality of first spherical particles are arranged in one layer in the first insulating substrate, and
the plurality of second spherical particles are arranged in one layer in the second insulating substrate.

3. The composite electronic component of claim 1, wherein the plurality of spherical particles contains ten or more spherical particles disposed in each of the first insulating substrate and the second insulating substrate.

4. The composite electronic component of claim 1, wherein a thickness of the first insulating substrate is 35 μm or more and 150 μm or less.

5. The composite electronic component of claim 1, wherein a ratio of a thickness of the first insulating substrate to an average particle size of the plurality of spherical particles is 0.8 or more and 1.2 or less.

6. The composite electronic component of claim 1, wherein at least a portion of the plurality of spherical particles protrude from both above and below surfaces, opposing each other in the first direction, of the first insulating substrate and the second insulating substrate.

7. The composite electronic component of claim 1, further comprising a first terminal electrode disposed on the first insulating substrate and a second terminal electrode disposed on the second insulating substrate.

8. The composite electronic component of claim 7, wherein
the first terminal electrode includes a first connection portion disposed on an upper surface of the first insulating substrate, a first mounting portion disposed on a lower surface of the first insulating substrate, and a first linking portion disposed on one side surface of the first insulating substrate, and
the second terminal electrode includes a second connection portion disposed on an upper surface of the second insulating substrate, a second mounting portion disposed on a lower surface of the second insulating substrate, and a second linking portion disposed on one side surface of the second insulating substrate.

9. The composite electronic component of claim 7, further comprising:
a first solder portion connecting the first external electrode to the first terminal electrode and a second solder portion connecting the second external electrode to the second terminal electrode.

10. The composite electronic component of claim 1, wherein an average thickness of the dielectric layer is 0.4 μm or less.

11. The composite electronic component of claim 1, wherein
an average thickness of the first internal electrode is 0.4 µm or less, and
an average thickness of the second internal electrode is 0.4 µm or less.

12. A board on which the composite electronic component of claim 1 is mounted, the board comprising:
a printed circuit board having a plurality of electrode pads on one surface thereof;
the composite electronic component of claim 1 installed on the printed circuit board; and
a solder connecting the plurality of electrode pads to the composite electronic component.

13. The board of claim 12, wherein the solder includes a plurality of spherical particles.

14. The board of claim 12, wherein
the plurality of spherical particles comprises a plurality of first spherical particles disposed in the first insulating substrate and a plurality of second spherical particles disposed in the second insulating substrate,
the plurality of first spherical particles are arranged as one layer in the second and third directions in the first insulating substrate, and
the plurality of second spherical particles are arranged as one layer in the second direction and the third direction in the second insulating substrate.

15. The board of claim 12, wherein a thickness of the first insulating substrate is larger than an average particle size of the spherical particles.

16. The board of claim 12, wherein a thickness of the first insulating substrate is smaller than an average particle size of the spherical particles.

17. The board of claim 12, wherein the plurality of spherical particles contains ten or more spherical particles disposed in each of the first insulating substrate and the second insulating substrate.

18. The board of claim 12, further comprising a first terminal electrode disposed on an upper surface, a lower surface, and a side surface of the first insulating substrate and a second terminal electrode disposed on an upper surface, a lower surface, and a side surface of the second insulating substrate.

19. The board of claim 18, wherein
the first terminal electrode is disposed on an outer surface and is not disposed on an inner surface, among both side surfaces of the first insulating substrate facing each other in the second direction, and
the second terminal electrode is disposed on an outer surface and is not disposed on an inner surface, among both side surfaces of the second insulating substrate facing each other in the second direction.

* * * * *